United States Patent
Jiang et al.

(10) Patent No.: US 8,101,953 B2
(45) Date of Patent: Jan. 24, 2012

(54) THIN FILM TRANSISTOR HAVING A PLURALITY OF CARBON NANOTUBES

(75) Inventors: Kai-Li Jiang, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 303 days.

(21) Appl. No.: 12/384,329

(22) Filed: Apr. 2, 2009

(65) Prior Publication Data
US 2009/0283754 A1  Nov. 19, 2009

(30) Foreign Application Priority Data
May 14, 2008 (CN) .......................... 2008 1 0067172

(51) Int. Cl.
- H01L 29/10 (2006.01)
- H01L 29/76 (2006.01)
- H01L 31/036 (2006.01)
- H01L 31/112 (2006.01)
- H01L 27/108 (2006.01)
- H01L 29/04 (2006.01)
- H01L 29/12 (2006.01)
- H01L 31/0376 (2006.01)
- H01L 31/20 (2006.01)

(52) U.S. Cl. .............. 257/66; 257/57; 257/69; 977/723; 977/842; 977/938

(58) Field of Classification Search .................. 257/57, 257/66, 69; 977/723, 842, 938
See application file for complete search history.

(56) References Cited

U.S. PATENT DOCUMENTS

| | | | |
|---|---|---|---|
| 6,423,583 B1 | 7/2002 | Avouris et al. | |
| 6,814,832 B2 | 11/2004 | Utsunomiya | |
| 6,899,945 B2 | 5/2005 | Smalley et al. | |
| 6,921,575 B2 | 7/2005 | Horiuchi et al. | |
| 7,051,945 B2 * | 5/2006 | Empedocles et al. | 235/492 |
| 7,253,431 B2 * | 8/2007 | Afzali-Ardakani et al. | 257/20 |
| 7,285,501 B2 | 10/2007 | Mardilovich et al. | |

(Continued)

FOREIGN PATENT DOCUMENTS
CN  1484865  3/2004
(Continued)

OTHER PUBLICATIONS

Jiang et al. ("Spinning and processing continuous yarns from 4-inch wafer scale super-aligned carbon nanotube arrays", Advanced Materials, 18, pp. 1505-1510, 2006).

(Continued)

*Primary Examiner* — Ida M Soward
(74) *Attorney, Agent, or Firm* — Altis Law Group, Inc.

(57) ABSTRACT

A thin film transistor includes a source electrode, a drain electrode, a semiconducting layer, and a gate electrode. The drain electrode is spaced from the source electrode. The semiconducting layer is connected to the source electrode and the drain electrode. The gate electrode is insulated from the source electrode, the drain electrode, and the semiconducting layer by an insulating layer. The semiconducting layer includes at least two stacked carbon nanotube films. Each carbon nanotube film includes an amount of carbon nanotubes. At least a part of the carbon nanotubes of each carbon nanotube film are aligned along a direction from the source electrode to the drain electrode.

17 Claims, 5 Drawing Sheets

U.S. PATENT DOCUMENTS

| | | | |
|---|---|---|---|
| 7,323,730 B2 * | 1/2008 | Borghetti et al. | 257/290 |
| 7,359,888 B2 * | 4/2008 | Snider | 706/26 |
| 7,399,400 B2 | 7/2008 | Soundarrajan et al. | |
| 7,537,975 B2 | 5/2009 | Moon et al. | |
| 7,812,342 B2 * | 10/2010 | Lee et al. | 257/40 |
| 7,838,809 B2 * | 11/2010 | Ludwig | 250/214 A |
| 2002/0163079 A1 | 11/2002 | Awano | |
| 2004/0251504 A1 | 12/2004 | Noda | |
| 2005/0061496 A1 | 3/2005 | Matabayas, Jr. | |
| 2005/0079659 A1 | 4/2005 | Duan et al. | |
| 2005/0106846 A1 | 5/2005 | Dubin et al. | |
| 2005/0189535 A1 | 9/2005 | Hsueh et al. | |
| 2006/0137817 A1 | 6/2006 | Ma et al. | |
| 2006/0249817 A1 | 11/2006 | Kawase et al. | |
| 2007/0004191 A1 | 1/2007 | Gu et al. | |
| 2007/0012922 A1 | 1/2007 | Harada et al. | |
| 2007/0029612 A1 | 2/2007 | Sandhu | |
| 2007/0069212 A1 | 3/2007 | Saitoh et al. | |
| 2007/0085460 A1 | 4/2007 | Harutyunyan et al. | |
| 2007/0108480 A1 | 5/2007 | Nanai et al. | |
| 2007/0132953 A1 | 6/2007 | Silverstein | |
| 2007/0138010 A1 | 6/2007 | Ajayan | |
| 2007/0228439 A1 * | 10/2007 | Duan et al. | 257/296 |
| 2007/0273796 A1 | 11/2007 | Silverstein et al. | |
| 2007/0273797 A1 | 11/2007 | Silverstein et al. | |
| 2007/0273798 A1 | 11/2007 | Silverstein et al. | |
| 2008/0042287 A1 | 2/2008 | Furukawa et al. | |
| 2008/0121996 A1 * | 5/2008 | Park et al. | 257/365 |
| 2008/0134961 A1 | 6/2008 | Bao et al. | |
| 2008/0173864 A1 * | 7/2008 | Fujita et al. | 257/40 |
| 2008/0252202 A1 | 10/2008 | Li et al. | |
| 2008/0265293 A1 * | 10/2008 | Lee et al. | 257/288 |
| 2008/0277718 A1 | 11/2008 | Ionescu et al. | |
| 2009/0042136 A1 | 2/2009 | Tour et al. | |
| 2009/0072223 A1 * | 3/2009 | Awano | 257/24 |
| 2009/0098453 A1 | 4/2009 | Liu et al. | |
| 2009/0159891 A1 | 6/2009 | Daniel et al. | |
| 2009/0224230 A1 * | 9/2009 | Pesetski et al. | 257/24 |
| 2009/0224292 A1 | 9/2009 | Asano et al. | |
| 2009/0256594 A1 | 10/2009 | Zhu | |
| 2009/0272967 A1 | 11/2009 | Afzali-Ardakani et al. | |
| 2009/0282802 A1 | 11/2009 | Cooper et al. | |
| 2010/0028613 A1 | 2/2010 | Schmidt et al. | |
| 2010/0108988 A1 * | 5/2010 | Grebel et al. | 257/24 |
| 2010/0252802 A1 | 10/2010 | Numata et al. | |
| 2010/0264403 A1 * | 10/2010 | Sirringhaus et al. | 257/24 |

FOREIGN PATENT DOCUMENTS

| | | |
|---|---|---|
| CN | 1490856 A | 4/2004 |
| CN | 1745468 | 3/2006 |
| CN | 1823426 | 8/2006 |
| CN | 1853268 | 10/2006 |
| JP | 2007-73706 | 3/2007 |
| JP | 2007-123870 | 5/2007 |
| JP | 2009-32894 | 2/2009 |
| WO | WO2004032193 | 4/2004 |
| WO | 2005114708 | 12/2005 |
| WO | WO2006093601 A2 | 9/2006 |
| WO | WO2007089322 | 8/2007 |
| WO | WO2007126412 | 11/2007 |
| WO | WO2008075642 | 6/2008 |

OTHER PUBLICATIONS

IBM research article on IBM research site (enclosed herein, 2004).

Minko et al. "Two-level structured self-adaptive surfaces with reversibly tunable properties", Journal of American Chemical Society, 125, pp. 3896-3900, 2003.

R. E. I. Schropp, B. Stannowski, J. K. Rath, New challenges in thin film transistor research, Journal of Non-Crystalline Solids, 299-302, 2002, 1304-1310, 2002.

Hines "Nanotransfer printing of organic and carbon nanotube thin-film transistors on plastic substrates", Applied Physics Letters, 86, 163101 (2005).

Ryu "Low-Temperature Growth of Carbon Nanotube by Plasma-Enhanced Chemical Vapor Deposition using Nickel Catalyst". Jpn. J. Appl. Phys. vol. 42, pp. 3578-3581 (2003).

Li "Removal of shells of multi-wall carbon nanotubes by repeatedly scanning bias voltage" Science in China Ser. E, Technological Sciences, vol. 47 No. 1 pp. 1-5 (2004).

Meitl et al., Solution Casting and Transfer Printing Single-Walled Carbon Nanotube Films, Nano Letters, 2004, vol. 4, No. 9.

* cited by examiner

THIN FILM TRANSISTOR HAVING A PLURALITY OF CARBON NANOTUBES

RELATED APPLICATIONS

This application is related to commonly-assigned applications entitled, "METHOD FOR MAKING THIN FILM TRANSISTOR", filed Ser. No. 12/384,245; "METHOD FOR MAKING THIN FILM TRANSISTOR", filed Ser. No. 12/384,331; "THIN FILM TRANSISTOR", filed Ser. No. 12/384,309; "THIN FILM TRANSISTOR", filed Ser. No. 12/384,310; "THIN FILM TRANSISTOR PANEL", filed Ser. No. 12/384,244; "THIN FILM TRANSISTOR", filed Ser. No. 12/384,281; "THIN FILM TRANSISTOR", filed Ser. No. 12/384,299; "THIN FILM TRANSISTOR", filed Ser. No. 12/384,292; "THIN FILM TRANSISTOR", filed Ser. No. 12/384,293; "THIN FILM TRANSISTOR", filed Ser. No. 12/384,330; "METHOD FOR MAKING THIN FILM TRANSISTOR", filed Ser. No. 12/384,241; "THIN FILM TRANSISTOR", filed Ser. No. 12/384,238. The disclosures of the above-identified applications are incorporated herein by reference.

BACKGROUND

1. Field of the Invention

The present invention relates to thin film transistors and, particularly, to a carbon nanotube based thin film transistor.

2. Discussion of Related Art

A typical thin film transistor (TFT) is made of a substrate, a gate electrode, an insulation layer, a drain electrode, a source electrode, and a semiconducting layer. The thin film transistor performs a switching operation by modulating an amount of carriers accumulated in an interface between the insulation layer and the semiconducting layer from an accumulation state to a depletion state, with applied voltage to the gate electrode, to change an amount of the current passing between the drain electrode and the source electrode.

In prior art, the material of the semiconducting layer is amorphous silicone (a-Si), poly-silicone (p-Si), or organic semiconducting material. The carrier mobility of an a-Si TFT is relatively lower than a p-Si TFT. However, the method for making the p-Si TFT is complicated and has a high cost. The organic TFT is flexible but has low carrier mobility.

Carbon nanotubes (CNTs) are a novel carbonaceous material and received a great deal of interest since the early 1990s. Carbon nanotubes have interesting and potentially useful heat conducting, electrical conducting, and mechanical properties. Further, there are two kinds of carbon nanotubes: metallic carbon nanotubes and semiconducting carbon nanotubes determined by the arrangement of the carbon atoms therein. The carrier mobility of semiconducting carbon nanotubes along a length direction thereof can reach about 1000 to 1500 $cm^2V^{-1}s^{-1}$. Thus, in prior art, a TFT adopting carbon nanotubes as a semiconducting layer has been produced. The carbon nanotubes in the conventional TFT are distributed disorderly to form a disordered carbon nanotube layer or perpendicular to the substrate to form a carbon nanotube array.

However, in the disordered carbon nanotube layer, the carbon nanotubes are arranged disorderly. The paths in the disordered carbon nanotube layer for carriers to travel are relatively long. Thus, the carrier mobility of the disordered carbon nanotube layer is relatively low. Further, the disordered carbon nanotube layer is formed by printing a mixture of a solvent with the carbon nanotubes dispersed therein on the substrate. The carbon nanotubes in the disordered carbon nanotube layer are joined or combined to each other by an adhesive agent. Thus, the disordered carbon nanotube layer is a loose structure and not suitable for being used in a flexible TFT.

In the carbon nanotube array, the carbon nanotubes are perpendicular to the substrate. However, the carbon nanotubes have good carrier mobility along the length direction thereof. Thus, the carrier mobility of the carbon nanotube array along a direction parallel to the substrate is relatively low.

Therefore, the carrier mobility of the two kinds of carbon nanotube layers are both relatively low, and the property of the high carrier mobility of the carbon nanotubes are not effectively used. Further, the carbon nanotube layers are both inflexible.

What is needed, therefore, is a TFT in which the above problems are eliminated or at least alleviated.

BRIEF DESCRIPTION OF THE DRAWINGS

Many aspects of the present thin film transistor can be better understood with references to the following drawings. The components in the drawings are not necessarily drawn to scale, the emphasis instead being placed upon clearly illustrating the principles of the present thin film transistor.

Figure 1:
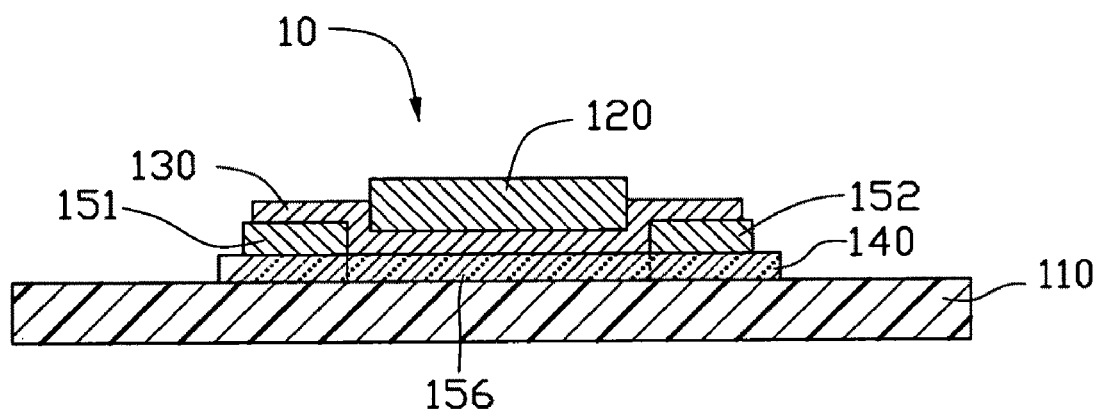
FIG. 1 is a cross sectional view of a thin film transistor in accordance with a first embodiment.

Corresponding reference characters indicate corresponding parts throughout the several views. The exemplifications set out herein illustrate at least one embodiment of the present thin film transistor, in at least one form, and such exemplifications are not to be construed as limiting the scope of the invention in any manner.

DETAILED DESCRIPTION OF EXEMPLARY EMBODIMENTS

References will now be made to the drawings to describe, in detail, embodiments of the present thin film transistor.

Referring to FIG. 1, a thin film transistor 10 is provided in a first embodiment, and has a top gate structure. The thin film transistor 10 includes a semiconducting layer 140, a source electrode 151, a drain electrode 152, an insulating layer 130, and a gate electrode 120. The thin film transistor 10 is disposed on an insulating substrate 110.

The semiconducting layer 140 is disposed on the insulating substrate 110. The source electrode 151 and the drain electrode 152 are spaced therebetween and electrically connected to the semiconducting layer 140. The insulating layer 130 is disposed between the semiconducting layer 140 and the gate electrode 120. The insulating layer 130 is disposed at least on the semiconducting layer 140, or covers the semiconducting layer 140, the source electrode 151, and the drain electrode 152. The gate electrode 120 is disposed on the insulating layer 130. The gate electrode 120 is disposed above the semiconducting layer 140 and insulating from the semiconducting layer 140, the source electrode 151, and the drain electrode 152 by the insulating layer 130. A channel 156 is formed in the semiconducting layer 140 at a region between the source electrode 151 and the drain electrode 152.

The source electrode 151 and the drain electrode 152 can be disposed on the semiconducting layer 140 or on the insulating substrate 110. More specifically, the source electrode 151 and the drain electrode 152 can be disposed on a top surface of the semiconducting layer 140, and at the same side of the semiconducting layer 140 as the gate electrode 120. In other embodiments, the source electrode 151 and the drain electrode 152 can be disposed on the insulating substrate 110 and covered by the semiconducting layer 140. The source electrode 151 and the drain electrode 152 are at a different side of the semiconducting layer 140 from the gate electrode 120. In other embodiments, the source electrode 151 and the drain electrode 152 can be formed on the insulating substrate 110, and coplanar with the semiconducting layer 140.

The insulating substrate 110 is provided for supporting the thin film transistor 10. The material of the insulating substrate 110 can be the same as a substrate of a printed circuit board (PCB), and can be selected from inflexible materials (e.g., p-type or n-type silicon, silicon with an silicon dioxide layer formed thereon, crystal, crystal with a oxide layer formed thereon), or flexible materials (e.g., plastic or resin). In the present embodiment, the material of the insulating substrate is glass. The shape and size of the insulating substrate 110 is arbitrary. A plurality of thin film transistors 10 can be patterned on the insulating substrate 110 to form a thin film transistor panel.

The material of the semiconducting layer 140 includes a carbon nanotube layer. The carbon nanotube layer comprises at least two stacked carbon nanotube films. Each carbon nanotube film includes a plurality of semiconducting carbon nanotubes joined end to end by van der Waals attractive force therebetween. In the carbon nanotube layer, at least a part of the carbon nanotubes are substantially oriented to one direction from the source electrode 151 to the drain electrode 152. In the present embodiment, the carbon nanotubes in the carbon nanotube layer are all aligned along the direction from the source electrode 151 to the drain electrode 152. The adjacent carbon nanotubes are combined by van der Waals attractive force therebetween.

Figure 2:
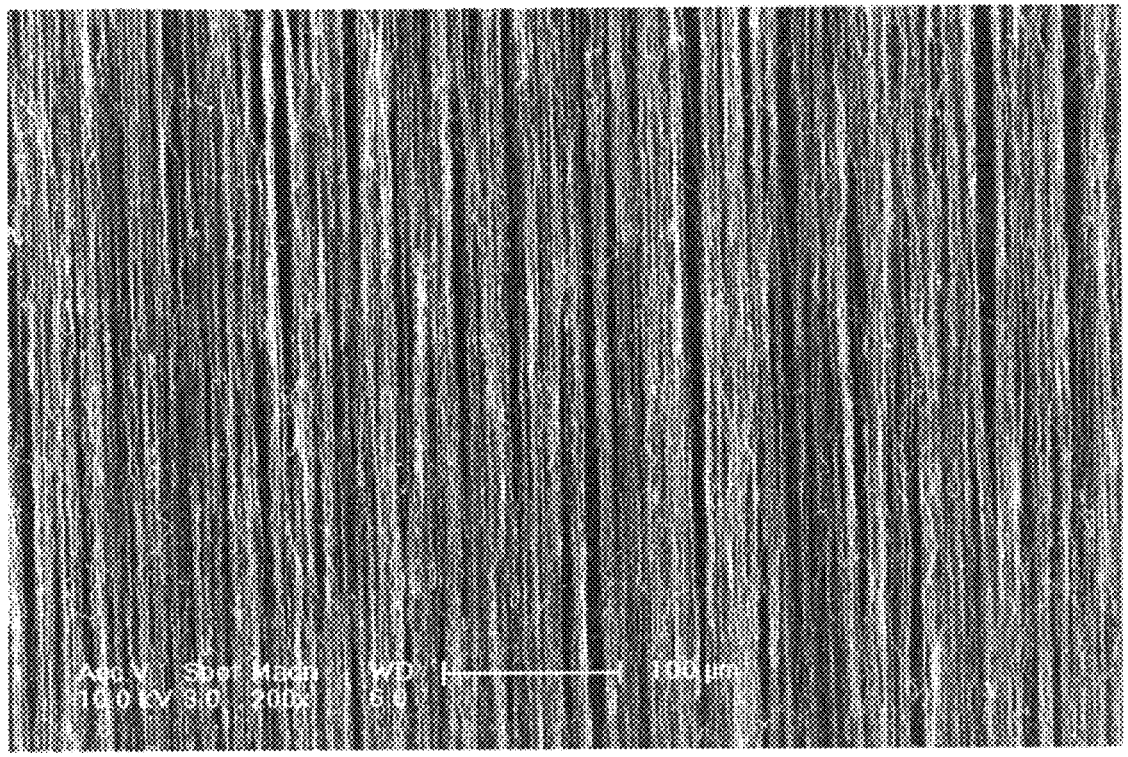
FIG. 2 shows a Scanning Electron Microscope (SEM) image of a carbon nanotube film containing metallic carbon nanotubes used in the thin film transistor of FIG. 1.
Figure 3:
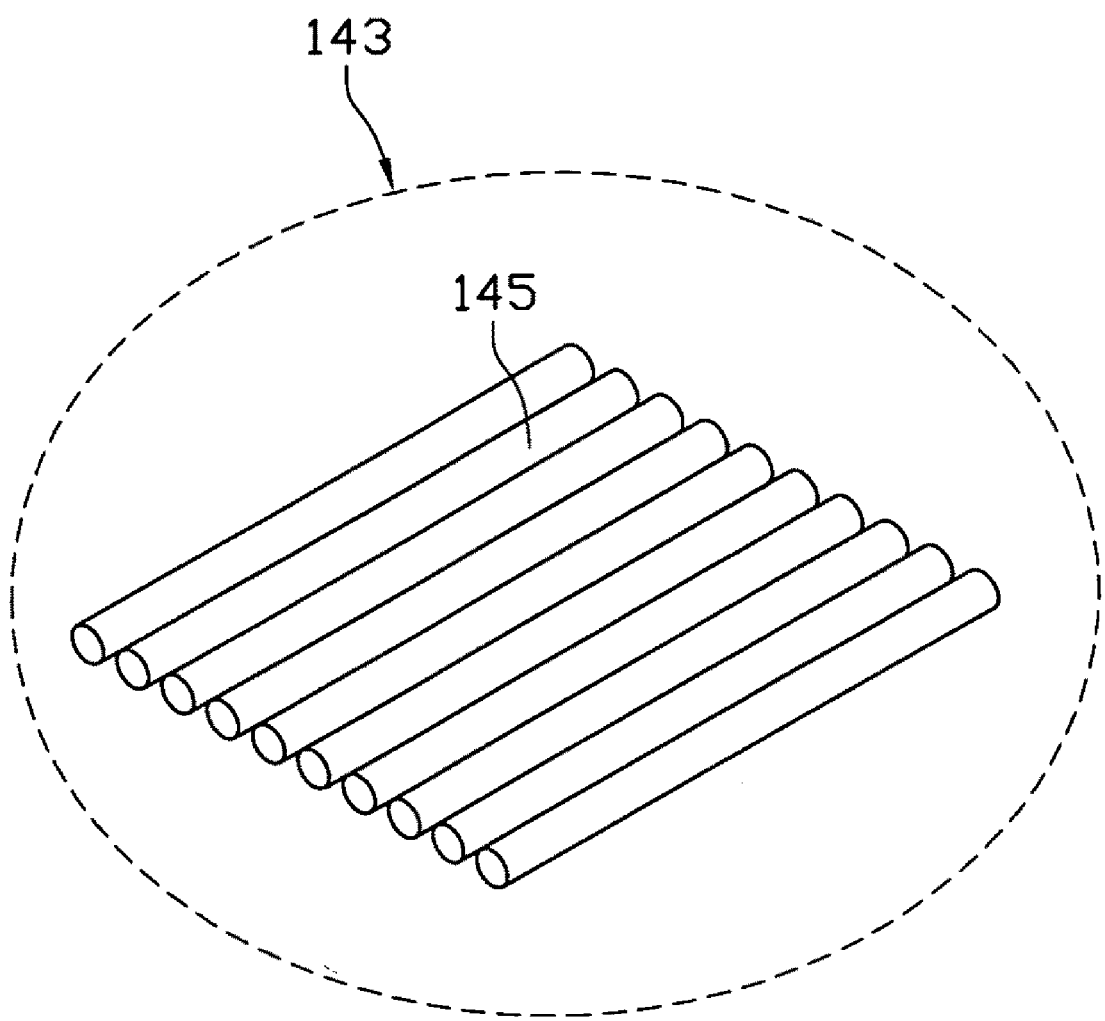
FIG. 3 is a structural schematic of a carbon nanotube segment.

Referring to FIGS. 2 and 3, each carbon nanotube film includes a plurality of successively oriented carbon nanotube segments 143 joined end-to-end by van der Waals attractive force therebetween. Each carbon nanotube segment 143 includes a plurality of carbon nanotubes 145 parallel to each other, and combined by van der Waals attractive force therebetween. The carbon nanotube segments 143 can vary in width, thickness, uniformity or shape. The carbon nanotubes 145 in the carbon nanotube film 143 are also oriented along a preferred orientation.

The length and width of the carbon nanotube film can be selected according to practical needs. The thickness of the carbon nanotube film can be approximately in a range from 0.5 nanometers to 100 microns. The carbon nanotubes in the carbon nanotube array can be single-walled carbon nanotubes, or double-walled carbon nanotubes. Diameters of the single-walled carbon nanotubes approximately range from 0.5 nanometers to 10 nanometers. Diameters of the double-walled carbon nanotubes approximately range from 1 nanometer to 50 nanometers. In the present embodiment, the carbon nanotubes are single-walled carbon nanotubes with the diameter less than 10 microns.

A length of the semiconducting layer 140 can be in an approximate range from 1 micron to 100 microns. A width of the semiconducting layer 140 can be in an approximate range from 1 micron to 1 millimeter. A thickness of the semiconducting layer 140 can be in an approximate range from 0.5 nanometers to 100 microns. A length of the channel 156 can be in an approximate range from 1 micron to 100 microns. A width of the channel 156 (i.e., a distance from the source electrode to the drain electrode) can be in an approximate range from 1 micron to 1 millimeter. In the present embodiment, the length of the semiconducting layer 140 is about 50 microns, the width of the semiconducting layer is about 300 microns, the thickness of the semiconducting layer 140 is about 25 nanometers, the length of the channel 156 is about 40 microns, and the width of the channel 156 is about 300 microns.

The carbon nanotube films in the carbon nanotube layer are drawn (pulled) from a carbon nanotube array. The carbon nanotube films are adhesive due to a large specific surface area of the carbon nanotubes and the high purity of the carbon nanotube film. Thus, the carbon nanotube films can be stacked adhered on the substrate 110 directly to form a carbon nanotube layer. More specifically, the carbon nanotube films can be adhered on the substrate 110 firstly, before the forming step of the source electrode 151 and the drain electrode 152 along the direction of the carbon nanotubes in the carbon nanotube films. Alternatively, the source electrode 151 and the drain electrode 152 can be formed on the substrate 110 firstly, before adhering the carbon nanotube films on the substrate 110 along the direction from the source electrode 151 and the drain electrode 152. The carbon nanotube layer cover on the source electrode 151 and the drain electrode 152.

In the present embodiment, the source electrode 151 and the drain electrode 152 are spaced therebetween, disposed on the opposite sides of the carbon nanotube layer, and electrically connected to the carbon nanotube layer.

The material of the source electrode 151, the drain electrode 152, and/or the gate electrode 120 is conductive. In the present embodiment, the source electrode 151, the drain electrode 152, and the gate electrode 120 are conductive films. A thickness of the conductive films can be in an approximately range from 0.5 nanometers to 100 microns. The material of the source electrode 151, the drain electrode 152, and the gate electrode 120 can be selected from the group consisting of metal, alloy, indium tin oxide (ITO), antimony tin oxide (ATO), silver paste, conductive polymer, or metallic carbon nanotubes. The metal or alloy can be selected from the group consisting of aluminum (Al), copper (Cu), tungsten (W), molybdenum (Mo), gold (Au), titanium (Ti), neodymium (Nd), palladium (Pd), cesium (Cs), and combinations thereof. In the present embodiment, the source electrode 151, the drain electrode 152, and the gate electrode 120 are Pd films. A thickness of the Pd films is about 5 nanometers. The Pd films have a good wettability with the carbon nanotube layer. The distance between the source electrode 151 and the drain electrode 152 is about 1 microns to 100 microns.

The material of the insulating layer 130 can be a rigid material such as silicon nitride ($Si_3N_4$) or silicon dioxide ($SiO_2$), or a flexible material such as polyethylene terephthalate (PET), benzocyclobutenes (BCB), or acrylic resins. A thickness of the insulating layer 130 can be in an approximate range from 5 nanometers to 100 microns. In the present embodiment, the insulating layer 130 is $Si_3N_4$.

Figure 4:
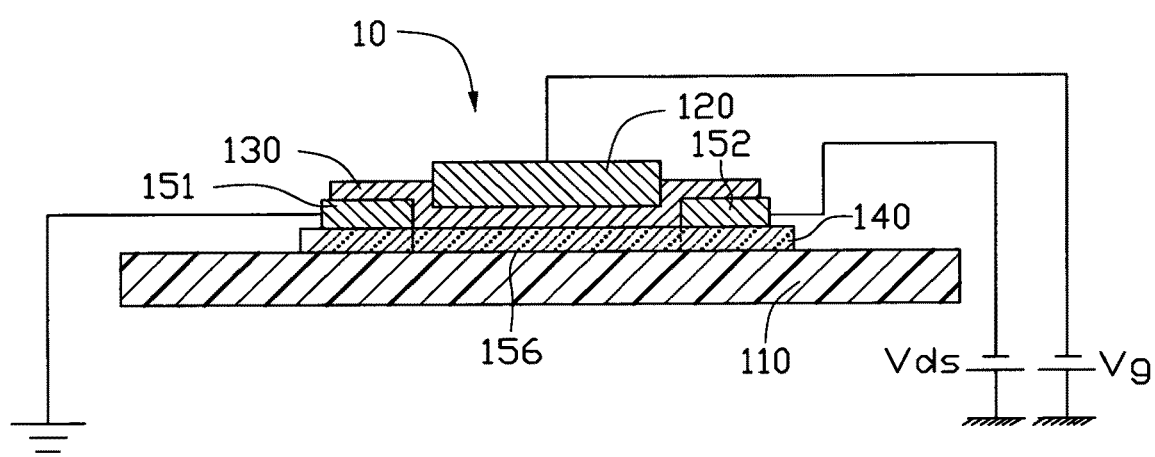
FIG. 4 is a schematic view of the thin film transistor of FIG. 1 connected to a circuit.

Referring to FIG. 4, in use, the source electrode 151 is grounded. A voltage Vds is applied on the drain electrode 152. Another voltage Vg is applied on the gate electrode el 120. The voltage Vg forms an electric field in the channel 156 of the semiconducting layer 140. Accordingly, carriers exist in the channel of the semiconducting layer 140 near the gate electrode 120. As the Vg increases, a current can flow through the channel 156. Thus, the source electrode 151 and the drain electrode 152 are electrically connected. The carrier mobility of the semiconducting carbon nanotubes along the length direction of the carbon nanotubes is relatively high, and the carbon nanotubes in the carbon nanotube layer are aligned substantially from the source electrode 151 to the drain electrode 152. Therefore, the paths for the carriers to travel in the semiconducting layer 140 is minimum, the carrier mobility of the thin film transistor 10 is relatively high. In the present embodiment, the carrier mobility of the thin film transistor 10 is higher than 10 $cm^2/V^{-1}s^{-1}$ (e.g., 10 to 1500 $cm^2/V^{-1}s^{-1}$), and the on/off current ratio is in an approximate range from $1.0\times10^2 \sim 1.0\times10^6$.

Figure 5:
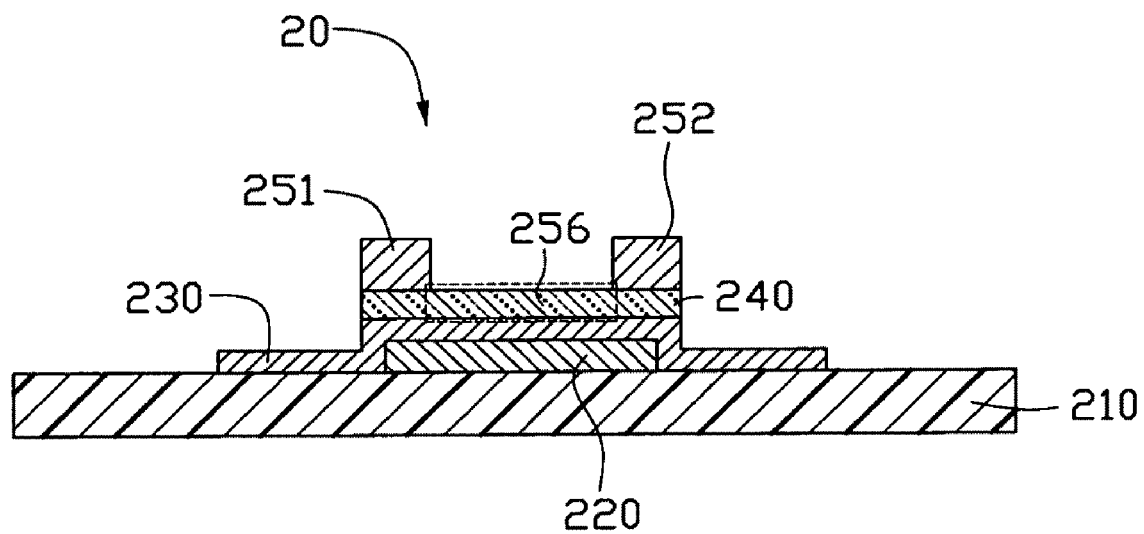
FIG. 5 is a cross sectional view of a thin film transistor in accordance with a second embodiment.

Referring to FIG. 5, a thin film transistor 20 is provided in a second embodiment and has a bottom gate structure. The thin film transistor 20 includes a gate electrode 220, an insulating layer 230, a semiconducting layer 240, a source electrode 251, and a drain electrode 252. The thin film transistor 20 is disposed on an insulating substrate 210.

The structure of the thin film transistor 20 in the second embodiment is similar to the thin film transistor 10 in the first embodiment. The difference is that, in the second embodiment, the gate electrode 220 is disposed on the insulating substrate 210. The insulating layer 230 covers the gate electrode 220. The semiconducting layer 240 is disposed on the insulating layer 230, and insulated from the gate electrode 220 by the insulating layer 230. The source electrode 251 and the drain electrode 252 are spaced apart from each other and electrically connected to the semiconducting layer 240. The source electrode 251, and the drain electrode 252 are insulated from the gate electrode 220 by the insulating layer 230. A channel 256 is formed in the semiconducting layer 240 at a region between the source electrode 251 and the drain electrode 252.

The source electrode 251 and the drain electrode 252 can be disposed on the semiconducting layer 240 or on the insulating layer 230. More specifically, the source electrode 251 and the drain electrode 252 can be disposed on a top surface of the semiconducting layer 240, and at the same side of the semiconducting layer 240 with the gate electrode 220. In other embodiments, the source electrode 251 and the drain electrode 252 can be disposed on the insulating layer 230 and covered by the semiconducting layer 240. The source electrode 251 and the drain electrode 252 are at another side of the semiconducting layer 240 different from the gate electrode 220. In other embodiments, the source electrode 251 and the drain electrode 252 can be formed on the insulating layer 230, and coplanar with the semiconducting layer 240.

The thin film transistors provided in the present embodiments have at least the following superior properties. Firstly, the carbon nanotubes in the carbon nanotube layer are aligned along the direction from the source electrode to the drain electrode. Thus, the threshold voltage of the semiconducting layer 140 is decreased, and the carrier mobility of the thin film transistor is relatively high. Secondly, the carbon nanotube layer including at least two stacked carbon nanotube films is tough and flexible. Thus, thin film transistors using metallic carbon nanotube layers as electrodes are durable and flexible. Thirdly, the carbon nanotube layer is durable under high temperatures. Therefore, the thin film transistor using carbon nanotube layer as the semiconducting layer can be used in high temperature. Fourthly, the thermal conductivity of the carbon nanotube layer is relatively high, and the carbon nanotubes in the carbon nanotube layer are aligned along the same direction. Thus, in use, heat produced by the thin film transistor can be rapidly spread out and easily dissipated.

It is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

The invention claimed is:

1. A thin film transistor comprising:
   a source electrode;
   a drain electrode spaced from the source electrode;
   a semiconducting layer connected to the source electrode and the drain electrode; and
   a gate electrode insulated from the source electrode, the drain electrode, and the semiconducting layer by an insulating layer,
   wherein the semiconducting layer comprises at least two stacked carbon nanotube films, each of the carbon nanotube films comprises a plurality of carbon nanotubes, at least a part of the carbon nanotubes of each of the carbon nanotube films are aligned along a direction from the source electrode to the drain electrode.

2. The thin film transistor of claim 1, wherein the carbon nanotubes in the carbon nanotube films are semiconducting carbon nanotubes.

3. The thin film transistor of claim 1, wherein the adjacent carbon nanotube films are combined by van der Waals attractive force therebetween.

4. The thin film transistor of claim 1, wherein the carbon nanotubes, in each of the carbon nanotube films, form segments that are successively joined end to end by van der Waals attractive force therebetween.

5. The thin film transistor of claim 1, wherein the carbon nanotube film comprises a plurality of successive carbon nanotube segments joined end to end by the van der Waals attractive force therebetween.

6. The thin film transistor of claim 5, wherein each carbon nanotube segment comprises a plurality of carbon nanotubes parallel to each other.

7. The thin film transistor of claim 1, wherein a thickness of the carbon nanotube film is in an range from about 0.5 nanometers to about 100 microns.

8. The thin film transistor of claim 1, wherein the carbon nanotubes are selected from the group consisting of the single-walled carbon nanotubes, double-walled carbon nanotubes, and combinations thereof.

9. The thin film transistor of claim 1, wherein a diameter of the carbon nanotubes is less than 10 nanometers.

10. The thin film transistor of claim 1, wherein the insulating layer is disposed between the semiconducting layer and the gate electrode.

11. The thin film transistor of claim 10, wherein the material of the insulating layer is selected from the group consisting of silicon nitride, silicon dioxide, polyethylene terephthalate, benzocyclobutenes, and acrylic resins.

12. The thin film transistor of claim 1, wherein the source electrode, the drain electrode, and the gate electrode comprise of at least one material selected from the group consisting of metal, alloy, indium tin oxide, antimony tin oxide, silver paste, conductive polymer, and metallic carbon nanotubes, the material of the metal is selected from the group consisting of aluminum, copper, tungsten, molybdenum, gold, titanium, neodymium, palladium, cesium, and combinations thereof.

13. The thin film transistor of claim 1, wherein the semiconducting layer is disposed on an insulating substrate, the source electrode and the drain electrode are disposed on an surface of the semiconducting layer, the insulating layer is disposed on the semiconducting layer, and the gate electrode is disposed on the insulating layer.

14. The thin film transistor of claim 1, wherein the gate electrode is disposed on an insulating substrate, the insulating layer is disposed on the gate electrode, the semiconducting layer is disposed on the insulating layer, the source electrode and the drain electrode are disposed on an surface of the semiconducting layer.

15. The thin film transistor of claim 1, wherein the carrier mobility of the thin film transistor is in a range from about 10 to about 1500 cm$^2$/V$^{-1}$s$^{-1}$, and the on/off current ratio is in a range from $1.0 \times 10^{2-} \sim 1.0 \times 10^6$.

16. The thin film transistor of claim 1 further comprising a channel, wherein the channel is defined in the semiconducting layer between the source electrode and the drain electrode.

17. The thin film transistor of claim 16, wherein the length of the channel is in an range from about 1 microns to about 100 microns, a width of the channel is in an range from about 1 microns to about 1 millimeter, a thickness of the channel is in an range from about 0.5 nanometers to about 100 microns.

* * * * *